United States Patent
Farkas et al.

(10) Patent No.: US 7,676,920 B2
(45) Date of Patent: Mar. 16, 2010

(54) METHOD OF PROCESSING A CIRCUIT BOARD

(75) Inventors: Sandor T. Farkas, Round Rock, TX (US); Hector F. Martinez, Austin, TX (US); Bhavesh Patel, Austin, TX (US); Indrani Paul, Round Rock, TX (US); Larry P. Robison, Jr., Pflugerville, TX (US); Darrell J. Slupek, Austin, TX (US); Aubrey Sparkman, Austin, TX (US)

(73) Assignee: Dell Products L.P., Round Rock, TX (US)

(*) Notice: Subject to any disclaimer, the term of this patent is extended or adjusted under 35 U.S.C. 154(b) by 330 days.

(21) Appl. No.: 11/549,869

(22) Filed: Oct. 16, 2006

(65) Prior Publication Data

US 2008/0087461 A1    Apr. 17, 2008

(51) Int. Cl.
*H01K 3/10*    (2006.01)
*G01R 31/02*   (2006.01)

(52) U.S. Cl. .............. 29/852; 29/830; 29/846; 324/754; 324/759; 324/765

(58) Field of Classification Search ........... 29/825, 29/830, 846, 852; 324/754, 759, 765
See application file for complete search history.

(56) References Cited

U.S. PATENT DOCUMENTS

| | | | | |
|---|---|---|---|---|
| 4,510,446 A | * | 4/1985 | Braun et al. | 324/766 |
| 5,377,404 A | * | 1/1995 | Berg | 29/830 |
| 6,232,559 B1 | * | 5/2001 | Janecek | 174/255 |
| 6,541,712 B1 | | 4/2003 | Gately et al. | |
| 7,013,563 B2 | * | 3/2006 | Durkot | 29/852 |
| 7,030,712 B2 | | 4/2006 | Brunette et al. | |
| 2004/0176938 A1 | | 9/2004 | Gisin et al. | |
| 2005/0231927 A1 | | 10/2005 | Masuyama et al. | |
| 2006/0090933 A1 | | 5/2006 | Wig et al. | |

OTHER PUBLICATIONS

Bill Birch, "Discussion on non-functional pad removal/backdrilling and PCB reliability", www.polarinstruments.com/support/reliability/pads-nopads.pdf, Mar. 28, 2005.

* cited by examiner

*Primary Examiner*—C. J Arbes
(74) *Attorney, Agent, or Firm*—Pramudji Wendt & Tran, LLP (57) ABSTRACT

A test coupon on a printed circuit board used for verifying that vias in the printed circuit board are back drilled to a proper predetermined depth. Use of the coupon involves correlating a via on the board to a via of a test coupon drilling the board via and the test coupon via to substantially the same depth, where the depth is predetermined based on the board via. Then measuring the impedance of the test coupon to reveal the actual depth of the back drilling of the coupon via. Knowing the actual back drill depth of the coupon via is used to verify the back drill depth of the board via.

9 Claims, 6 Drawing Sheets

METHOD OF PROCESSING A CIRCUIT BOARD

BACKGROUND

1. Technical Field

The present disclosure relates generally to information handling systems, and, more particularly, to circuit boards.

2. Background Information

As the value and use of information continues to increase, individuals and businesses seek additional ways to process and store information. One option available to users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Printed circuit boards (PCB) are typically included with the hardware components of the information handling system. PCBs may comprise multiple layers wherein along each layer conductive members are routed. These conductive members are typically referred to as traces. Vias, that are disposed generally perpendicular to the PCB, are used to provide electrical connectivity between different layers of the PCB. The PCB may also include test coupons for evaluating board characteristics, as well as for quality control and operability. The test coupons are generally disposed on each PCB. Analysis of the test coupons can involve destructive testing where portions of the coupon are cut away in order to visually inspect the board layers. Additionally, electrically testing the coupons can indicate board quality. One example of electrical testing involves measuring the impedance across the coupon.

SUMMARY

The following presents a general summary of several embodiments of the disclosure in order to provide a basic understanding of at least some embodiments of the disclosure. This summary is not an extensive overview of the disclosure. It is not intended to identify key or critical elements of the disclosure or to delineate the scope of the claims. The following summary merely presents some concepts of the disclosure in a general form as a prelude to the more detailed description that follows. All embodiments described in this disclosure including in the Summary and Detailed Description are intended to be non-limiting.

One embodiment of the disclosure provides a circuit board comprising, two circuit board layers and a first via providing electrical communication between the layers, and having at least a portion removed to a predetermined depth. The board also includes a test coupon having a second via providing electrical communication between the layers, and having at least a portion removed to a depth substantially equal to the predetermined depth.

Another embodiment described herein provides a method of processing a circuit board comprising, removing material from a first via disposed on the circuit board, removing a similar amount of material from a second via, wherein the second via is on a test coupon disposed on the circuit board, electrically evaluating the test coupon, and determining the amount of material removed from the test coupon via based on the electrical evaluation.

Even another embodiment provides an information handling system comprising a processor and a circuit board supporting the processor. The circuit board includes two circuit board layers. The board also includes a first via providing electrical communication between the layers, and having at least a portion removed to a predetermined depth. The board also includes a test coupon having a second via providing electrical communication between the layers, and having at least a portion removed to a depth substantially equal to the predetermined depth.

BRIEF DESCRIPTION OF THE DRAWINGS

For detailed understanding of the present disclosure, references should be made to the following detailed description of the several aspects, taken in conjunction with the accompanying drawings, in which like elements have been given like numerals and wherein:

FIGS. 3b, 4b, and 5b demonstrate Time Domain Reflectometry results that correspond to the drilling operations of FIGS. 3a-5a.

DETAILED DESCRIPTION

For purposes of this disclosure, an information handling system may include, but is not limited to, any instrumentality or aggregate of instrumentalities operable to compute, classify, process, transmit, receive, retrieve, originate, switch, store, display, manifest, detect, record, reproduce, handle, or utilize any form of information, intelligence, or data for business scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more data storage medium (such as a disk drive(s), a flash drive(s), a compact disk(s), combinations thereof, and the like), one or more network ports for communicating with external devices as well as various input and output (I/O) devices, such as a keyboard, a mouse, and a video display. The information handling system may also include one or more buses operable to transmit communications between the various hardware components.

Figure 1:
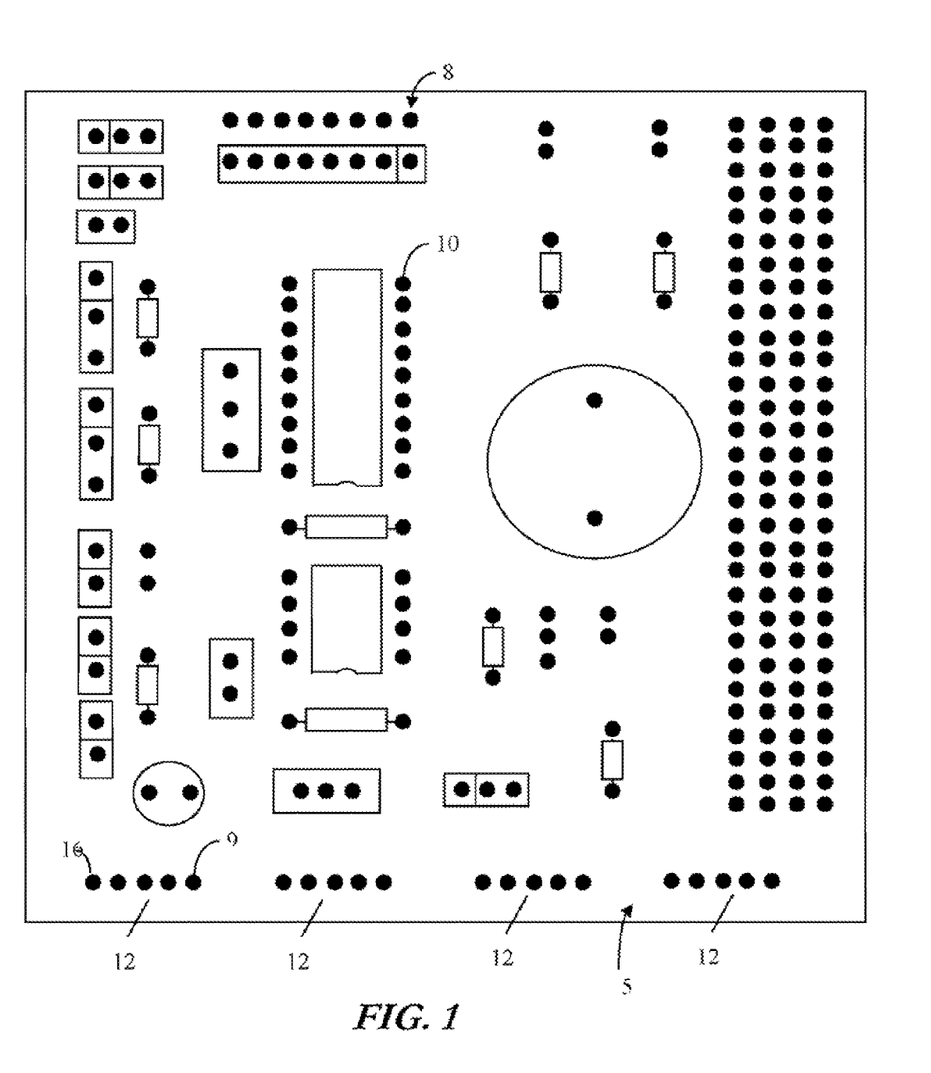
FIG. 1 provides an overhead view of a printed circuit board.

FIG. 1 depicts an overhead view of one example of a printed circuit board (PCB) 5. In this example the board 5 comprises a series of connector slots 8 formed to receive electrical components on the board. Such electrical components may include resistors, capacitors, conductors, and integrated circuits and the like. FIG. 1 further includes a board via 10 for providing electrical communication between layers of the PCB 5. A series of test coupons 12 are shown disposed along the bottom portion of the board 5. While these coupons 12 are located adjacent to the border of the board 5, in another embodiment, they may also be situated at other locations on the board 5. Similarly, although in FIG. 1 the coupons 12 are arranged generally parallel and along the same line, they can be disposed at different angles or configurations along the board 5 as needed. These coupons 12 also include a series of connector slots 9 formed at the upper ends of test coupon vias 16.

Figure 2:
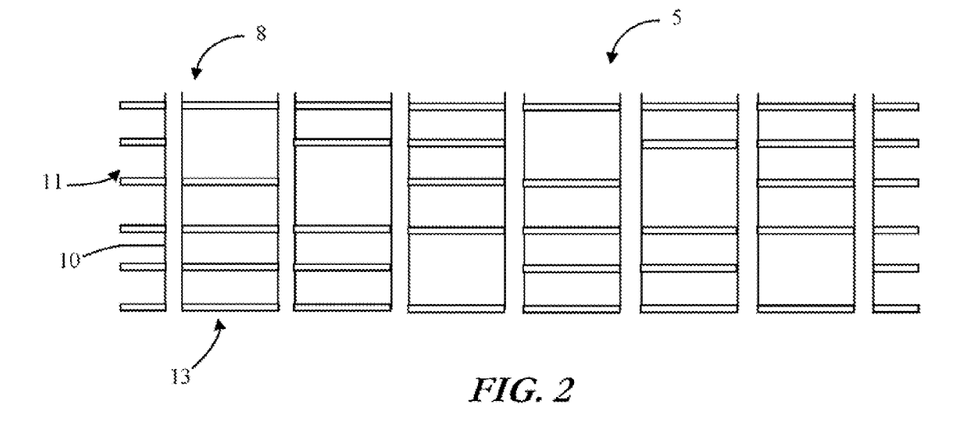
FIG. 2 illustrates a side cut-away view of a portion of a printed circuit board.

With reference now to FIG. 2, a portion of a printed circuit board 5 is shown in a cross-sectional view. In this cross-sectional view layers 11 are shown running generally perpendicular to the surface of the board 5. Traces 13 are included that run generally parallel to the plane of these layers 11, the traces 13 may provide electrical connectivity and conduction throughout their respective layer 11. Vias 10 are shown extending generally perpendicular to the board's surface, these vias 10 can provide connectivity and electrical communication between the traces 13 of the different layers 11. The connector slots 8 may be formed along the upper region of each via 10.

The design of each individual PCB 5 may result in an unused portion of a via 10 due to lack of required connectivity along one or more of the layers 11 intersected by via 10. The portion of this unused via 10 may be referred to as a stub. These stubs can cause impedance discontinuities and reflections that may have a negative effect on the performance of the board 5. Negative effects include increased jitter, signal attenuation, as well as reduced noise margins. These unused portions may be removed by back drilling with a mechanical drill bit thereby removing the via material. However due to the close tolerances of adjacent layers, the back drilling process can sometimes remove excessive material thereby opening a circuit designed to be closed. In other instances the back drilling may be to an insufficient depth. Therefore not enough material is removed. This leaves at least a portion of the undesired stub on the board 5. A predetermined back drill depth would remove via material from the surface of the board 5 and past each unused layer, but not remove via material adjacent to a layer having a trace that requires electrical connectivity to the via. As a non-limiting example, if a particular via required connectivity between the traces of layers 1 through 4, the desired pre-determined depth would extend from the surface of the board past layer 4, but not into layer 5.

Figure 3A:
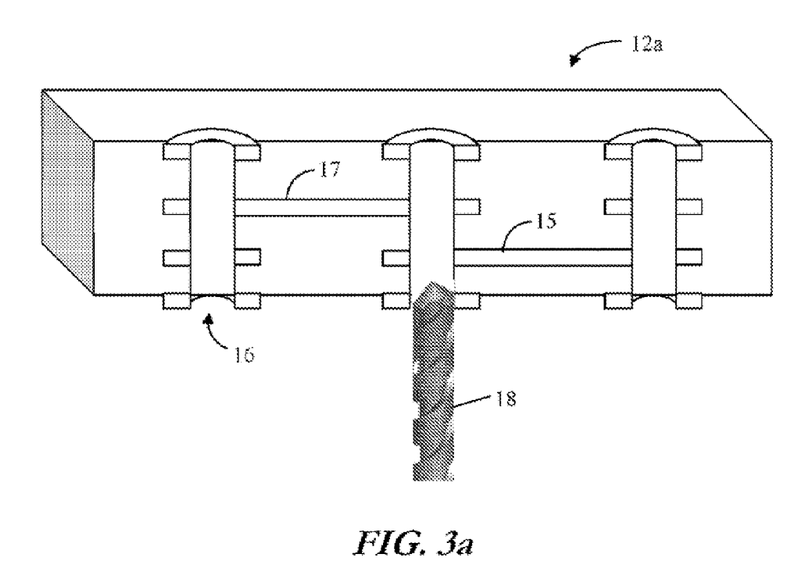
FIGS. 3a, 4a, and 5a depict a back drill process for removing via material.
Figure 4A:
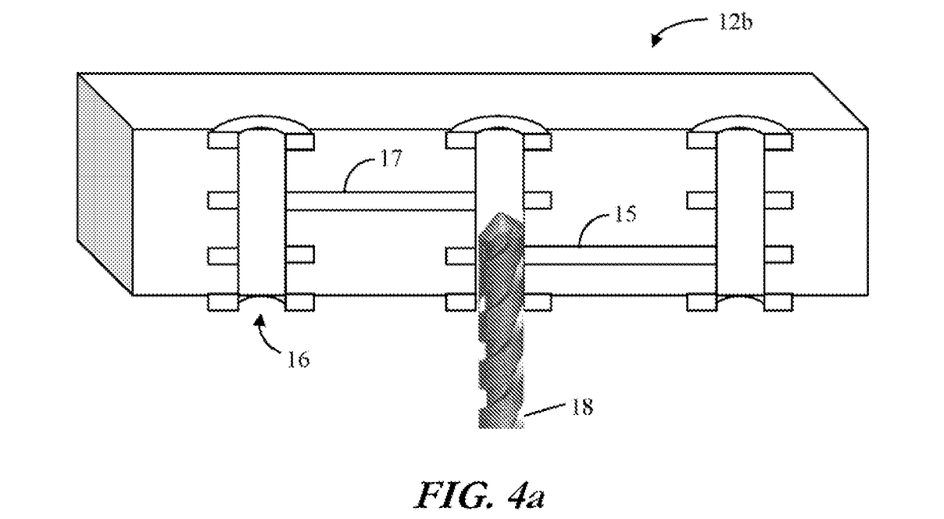
Figure 5A:
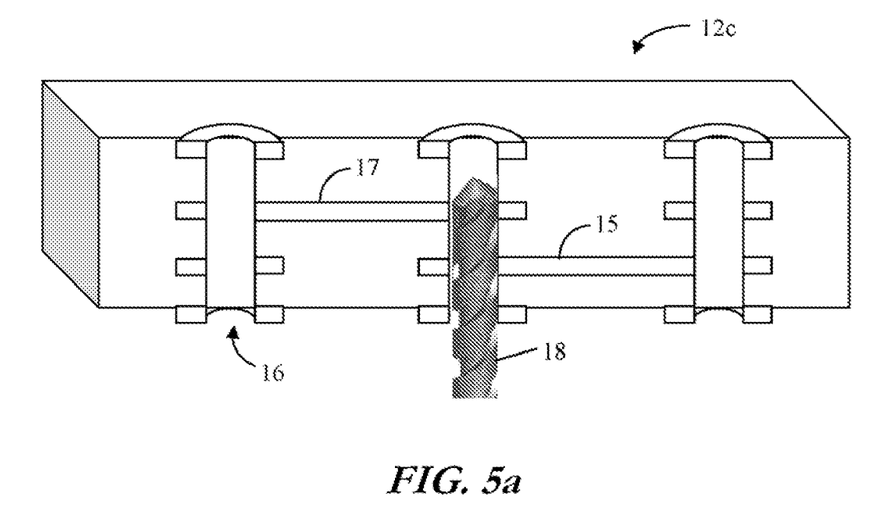

FIGS. 3a, 4a, and 5a illustrate a back drilling process with a test coupon, wherein the test coupon can be used to confirm that the vias of the board have been back drilled to the proper pre-determined depth. In one example of the method described herein, the test coupon 12a is configured to emulate a portion of the board 5 that is being drilled. That is, the test coupon 12a will be back drilled to substantially the same depth as a corresponding via on the board was previously back drilled. Using the method herein described, electrical connectivity testing across the test coupon 12a can determine if the back drill depth of the board via was performed to a desired depth.

Figure 3B:
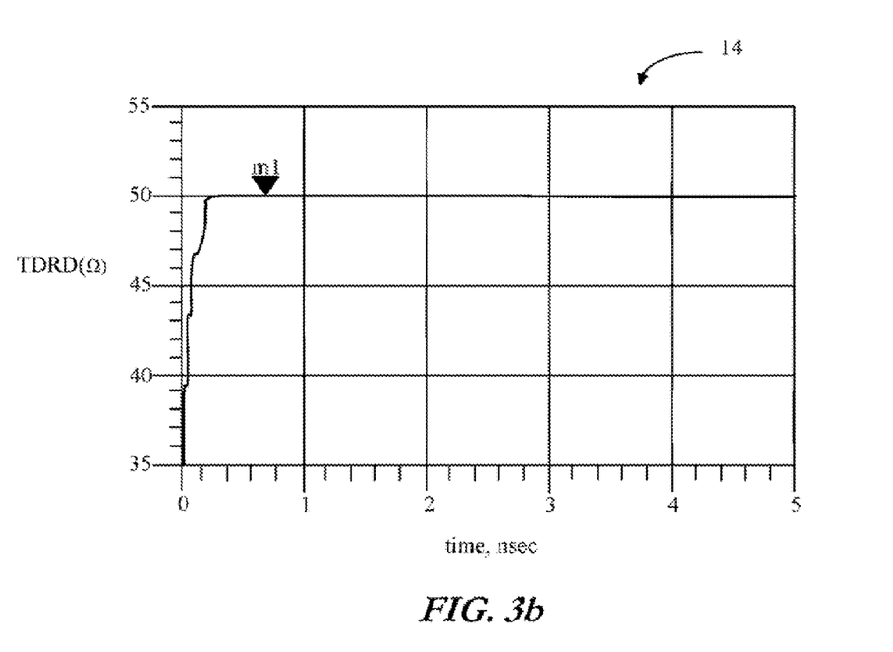

With specific reference now to FIG. 3a, a drill bit 18 is shown back drilling the bottom of a coupon via 16. In this instance the drill bit 18 removes material up to the lower trace 15. FIG. 3b provides one example of a use of the present method wherein a time domain reflectometer reading (TDR) is shown that graphically illustrates the measured impedance over time of the back drilled test coupon 12a of FIG. 3a. As a non-limiting example, the resulting measured impedance value reaches approximately 50 ohms on the scale as shown, which matches the measured impedance value taken prior to the back drilling of the coupon 12a. It should be understood that a printed circuit board may be designed to provide any desired impedance value. Thus the measured impedance reveals that the lower trace 15 still provides connection between the adjacent vias 16. Knowing the depth from the board surface up to the lower trace 15, and that vias on the main board 5 were back drilled to the same depth as the test coupon via 16, the back drill depth of vias on the main board 5 may be confirmed. It should be understood that optionally, the electrical testing may also include an in-circuit tester (ICT) for continuity measurements in measuring the coupons for verifying the back drill depth.

Figure 4B:
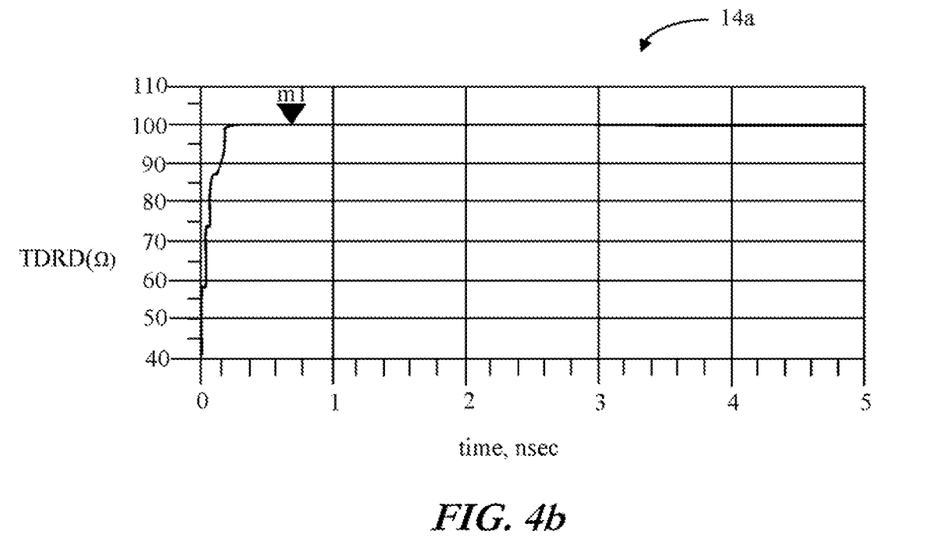

FIG. 4a illustrates the drill bit 18 back drilling within the via 16 and removing via material above the lower trace 15 but below the upper trace 17. Accordingly, connectivity provided by the layer trace 15 is eliminated by back drilling the via. The corresponding TDR chart of FIG. 4b reveals measured impedance greater than that of the coupon of FIG. 3a when testing the impedance across the test coupon 12b. As discussed above, knowing the depth between the board surface and between the upper traces 15 and lower traces 17, and the resulting impedance measurement, the actual back drill depth of the test coupon 12b may be confirmed. A determination of the back drill depth of the test coupon 12b in turn can be used to confirm the back drill depth of the vias on the board 5.

Figure 5B:
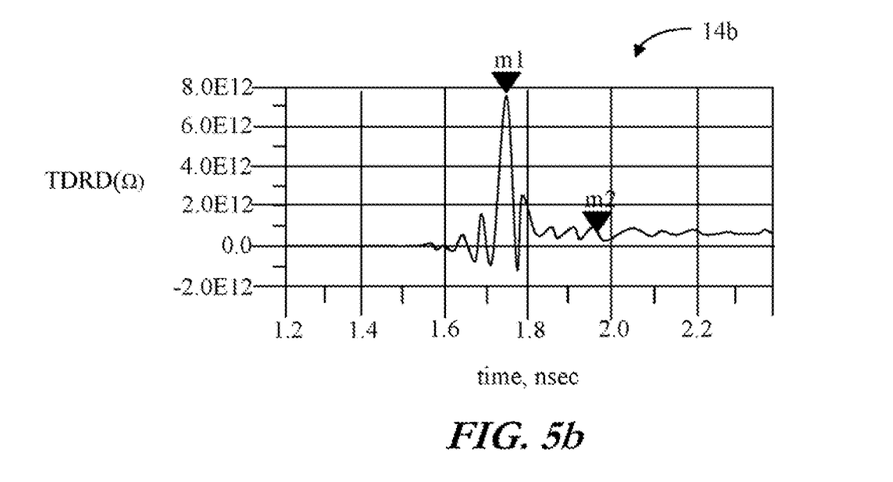

With reference now to FIG. 5a, another example of the method disclosed herein is shown wherein the drill bit 18 drills through a via and removes via material past both the lower trace 15 as well as the upper trace 17. The connectivity provided by both of these traces is thus removed. As such, the corresponding TDR plot of FIG. 5b indicates essentially infinite impedance when the impedance of this test coupon 12c is measured. Thus a reading of the impedance of FIG. 5b can indicate the back drill depth of the test coupon 12c and the corresponding back drill depths on the board 5.

FIGS. 3a through 5b are therefore illustrative that testing, such as electrical conductivity testing of a test coupon, can be used to evaluate if a desired back drill depth has been achieved on a printed circuit board 5. For example, if a via were to be drilled out to a point just below its lower most trace, then a subsequent back drilling of the same depth, could be performed on the test coupon 12. If the TDR values were similar to those of FIG. 3b, the proper back drill depth used in the PCB 5 could be confirmed. Using this same logic, the results of FIG. 4b could be relied upon to demonstrate that a back drill depth removing via material between the lower trace 15 and the upper trace 17 of the PCB could be achieved.

The present method is not limited to a situation of a test coupon having the number of traces shown in FIGS. 3a through 5a. Instead, the trace coupon could have at least as many trace layers as provided on the main board 5. Thus, in another example of use of the method herein described, all vias that are to have approximately the same amount of material removed could be identified as part of a group of vias. This group of vias would have a defined back drill depth in which it is desired to remove material from these vias roughly equal to this depth (assuming roughly or substantially equal drill bore diameters). After back drilling both this group of vias as well as the corresponding test coupon, the test coupon can be electrically tested to determine if in fact the back drilling was to pre-determined depth. Again, the confirmation would be in the form of electrical test results after measuring the impedance across a test coupon. It should be pointed out that the back drilling can occur from both the upper surface of the board 5 as well as the lower surface. For example if a group of vias on the board 5 could be identified wherein the outer most 3 layers were unnecessary and thus the via could be back drilled to a 3 layer depth. This group could therefore involve vias where being back drilled through layers 1-3, as well as layers 12, 11 and 10 (in a 12 layer board). Thus the present method and apparatus used herein can be used for boards having any number of layers considered.

As used herein, the concepts of roughly equal or substantially equal drill depths, drill bore diameters, or amounts removed, means, in one embodiment within 10 weight percent, in another embodiment within 5 weight percent, in even another embodiment within 2 weight percent, in still another embodiment within 1 weight percent, and in yet another embodiment within 0.5 weight percent. Of course, the drill depth must not be too shallow or too deep as discussed above.

Since it is possible to have groups of vias, wherein each group of via requires a different amount of via material to be removed, it is envisioned that a corresponding test coupon be included with a PCB 5 that can be situated and tested to confirm the back drill depth for each specific via group. Thus if one group of vias required material removed just past an outer most layer, a test coupon could be drilled to the same depth that this group of vias was back drilled. As described above, the test coupon impedance is then measured to confirm that a single layer had been removed. Thus the impedance measurement can confirm the proper back drill depth for this group. This process can be repeated for each via group identified thereby having a corresponding test coupon back drilled to the same depth as each group and subsequently tested.

Figure 6:
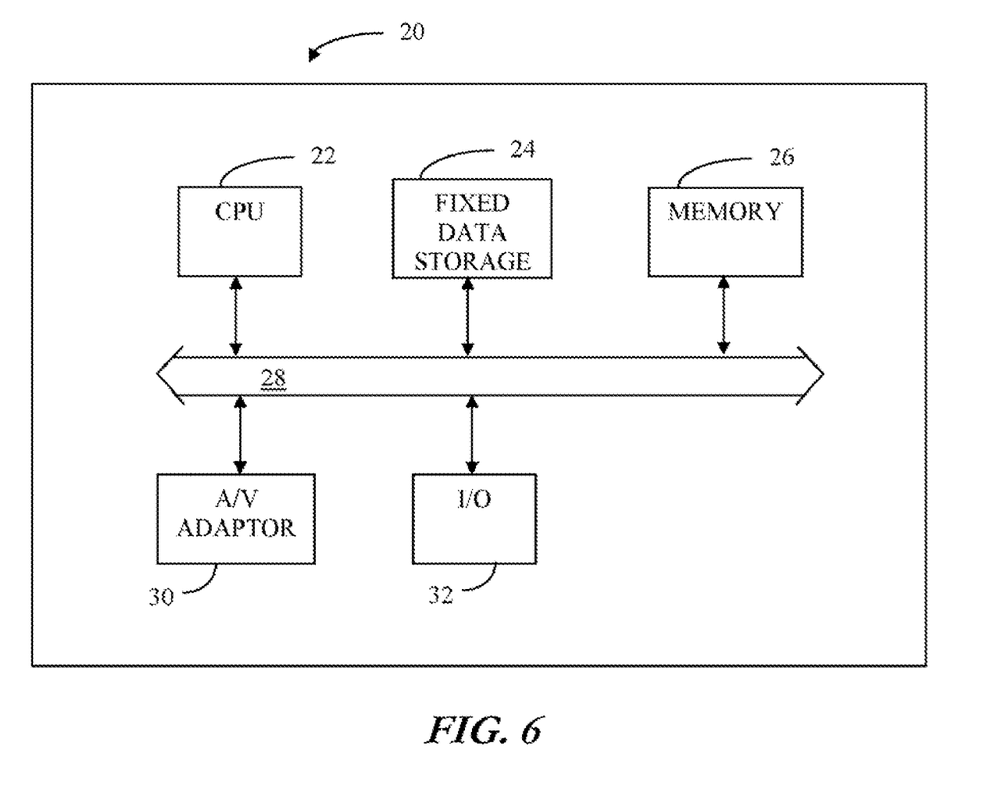
FIG. 6 is a schematic view of an information handling system.

FIG. 6 illustrates a non-limiting embodiment of an information handling system (IHS) 20 comprising a CPU 22. It should be understood that this disclosure has applicability to information handling systems as broadly described above, and is not intended to be limited to the IHS 20 as specifically described. The CPU 22 may comprise a processor, a microprocessor, minicomputer, or any other suitable device, including combinations thereof, for executing programmed instructions. The CPU 22 may also comprise a plurality of such processors, microprocessors, minicomputers, and other devices. The CPU 22 may be in data communication over a local interface bus 28 with fixed data storage 24 and memory 26.

The memory 26, as illustrated in FIG. 6 may include a non-volatile memory having a firmware program optionally stored therein, such as an initialization start-up program. The non-volatile memory may include, but is not limited to flash memory and electrically erasable programmable read-only memory (EEPROM). The firmware program may contain all the programming instructions required to control a keyboard, a display monitor, a mouse, a mobile data storage, other input/output devices not shown here, and a number of miscellaneous functions and/or devices. The memory 26 may also comprise a random access memory (RAM). The OS and application programs may be loaded into RAM for execution.

A fixed data storage device 24 may be used to store the OS, application programs, and other data for use by the IHS 20. A fixed data storage device refers to non-volatile storage devices including permanent and/or semi-permanent storage devices. Fixed data storage devices may include but are not limited to, a hard disk drive (HDD) and a magnetic tape drive. In addition, a mobile data storage device may interface with the local interface bus 28 for transferring data to and/or from IHS 20. Examples of mobile data storage include, but are not limited to: an external portable hard drive; a solid state semiconductor storage device, such as flash memory; and an optical disc storage device, such as a compact disc (CD) and/or a digital video disc (DVD).

The IHS 20 may further comprise a audio/video display adapter 30, a plurality of input/output interfaces 32, and a modem/network interface card (NIC). The input/output interface 32 may transmit data to a printer.

The apparatus and methods of this disclosure may be used on any high speed electronics equipment, even passive designs where there are no active components, just traces and connectors.

The present disclosure is to be taken as illustrative rather than as limiting the scope or nature of the claims below. Numerous modifications and variations will become apparent to those skilled in the art after studying the disclosure, including use of equivalent functional and/or structural substitutes for elements described herein, use of equivalent functional couplings for couplings described herein, and/or use of equivalent functional actions for actions described herein. Such insubstantial variations are to be considered within the scope of the claims below.

Given the above disclosure of general concepts and specific embodiments, the scope of protection is defined by the claims appended hereto. The issued claims are not to be taken as limiting Applicant's right to claim disclosed, but not yet literally claimed subject matter by way of one or more further applications including those filed pursuant to the laws of the United States and/or international treaty.

What is claimed is:

1. A method of processing a circuit board comprising:
   removing a first amount of material from a first via disposed on the circuit board;
   removing a second amount of material from a second via, wherein the second amount is substantially equal to the first amount, and the second via is on a test coupon disposed on the circuit board;
   electrically evaluating the test coupon; and
   determining the amount of material removed from the test coupon via based on the electrical evaluation.

2. The method of processing a printed circuit board of claim 1 wherein the steps of removing the first amount of material from the first via and removing the second amount of material from the second via comprises back drilling the first via and the second via.

3. The method of processing a circuit board of claim 1 wherein the step of electrically evaluating the test coupon comprises measuring impedance.

4. The method of processing a circuit board of claim 3 wherein the impedance is measured using a testing device selected from the group consisting of time domain reflectometer and in-circuit tester.

5. The method of processing a printed circuit board of claim 1 wherein the circuit board comprises groups of vias having the same predetermined depth and a corresponding test coupon for each group of vias, the method further comprising removing an amount of material from each vias of said group, based on the predetermined depth, and removing a substantially similar amount of material from a via of the corresponding test coupon.

6. The method of processing a circuit board of claim 5 wherein the step of removing the amount of material from each via comprises a back drilling the via.

7. The method of processing a circuit board of claim 1 further comprising adding the printed circuit board to an information handling system.

8. The method of processing a circuit board of claim 1, wherein the amount of material removed from the second via corresponds to the depth of material removed.

9. The method of processing a circuit board of claim 8, wherein the depth of material removed from the second via corresponds to the depth of material removed from the first via, said method further comprising comparing the depth of material removed from the first via from a predetermined depth of the first via.

* * * * *